United States Patent [19]
Siao et al.

[11] Patent Number: 5,708,671
[45] Date of Patent: Jan. 13, 1998

[54] TUNABLE GIGIHERTZ ALL-OPTICAL CLOCK GENERATOR AND METHOD USING SAME

[75] Inventors: Sueh-Wen Siao, San Diego; Zoaib Z. Rangwala, Cupertino, both of Calif.

[73] Assignee: Semi-Custom Logic, Inc., Sunnyvale, Calif.

[21] Appl. No.: 633,514

[22] Filed: Apr. 17, 1996

[51] Int. Cl.$^6$ .................. H01S 3/10; G02B 6/12
[52] U.S. Cl. .................. 372/20; 372/21; 372/43; 372/50; 372/98; 372/108; 385/14; 385/42; 385/132; 385/122
[58] Field of Search ............... 372/18, 19, 21, 372/25, 43, 45, 46, 50, 97, 98, 108, 20; 385/14, 42, 132, 122

[56] References Cited

U.S. PATENT DOCUMENTS

| | | | |
|---|---|---|---|
| 4,730,327 | 3/1988 | Gordon | 372/45 |
| 4,831,631 | 5/1989 | Haeussler et al. | 372/92 |
| 5,046,802 | 9/1991 | Yamamoto et al. | 359/328 |
| 5,079,772 | 1/1992 | Negus et al. | 372/18 |
| 5,349,593 | 9/1994 | Lomashevitch et al. | 372/50 |
| 5,349,598 | 9/1994 | Ouchi et al. | 372/50 |
| 5,390,202 | 2/1995 | Yan et al. | 372/26 |
| 5,416,790 | 5/1995 | Yodoshi et al. | 372/46 |
| 5,446,573 | 8/1995 | Lomashevitch et al. | 372/96 |
| 5,471,494 | 11/1995 | Mataki et al. | 372/50 |

OTHER PUBLICATIONS

A.I. Neophytou et al., "Demonstration of High–Q Injection Locked Optical Clock Consisting of Hybrid Distributed Feedback Bistable Laser System", Electronics Letters, Aug. 13, 1992, vol. 28, pp. 1631–1633.

*Primary Examiner*—Brian Healy
*Attorney, Agent, or Firm*—Thomas Schneck

[57] ABSTRACT

A fully integrated photonic IC for optical clock generation using no electronic current modulation. A first and second laser stripes are joined by a Kerr effect non-linear directional coupler, NLDC. The first stripe is pumped with a DC current for laser generation, and the second stripe has a reflector at an end facet for generation of mode selective optical feedback. The DC current generates relaxation oscillation in both stripes and the Kerr effect of the NLDC causes the electric fields in both stripe to interact constructively so as to shift the relaxation oscillation to undamped oscillation. The optical clock generator is tuned by varying the applied DC current.

29 Claims, 7 Drawing Sheets

TUNABLE GIGIHERTZ ALL-OPTICAL CLOCK GENERATOR AND METHOD USING SAME

TECHNICAL FIELD

The invention relates to a tunable optical clock generator and, in particular, to an all optically generated tunable optical clock generator.

BACKGROUND ART

Typical prior art optical clock generators require sophisticated external high frequency electrical modulators or expensive integrated electronic circuit designs. The need for high-speed, highly parallel optical signal processing containing as many as $10^5$ high performance processors has highlighted the severe limitations of current electrical interconnect capabilities. This has become a serious limiting factor in the area of optical clock generation.

Figure 1:
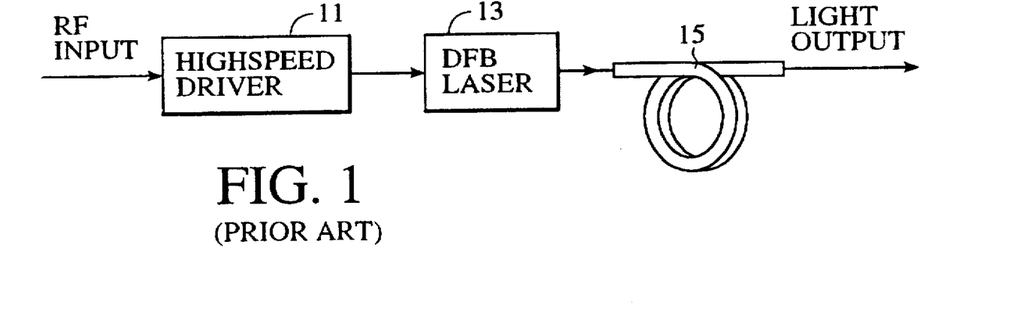
FIG. 1 is a block structure of a prior art optical clock generator.
Figure 2:
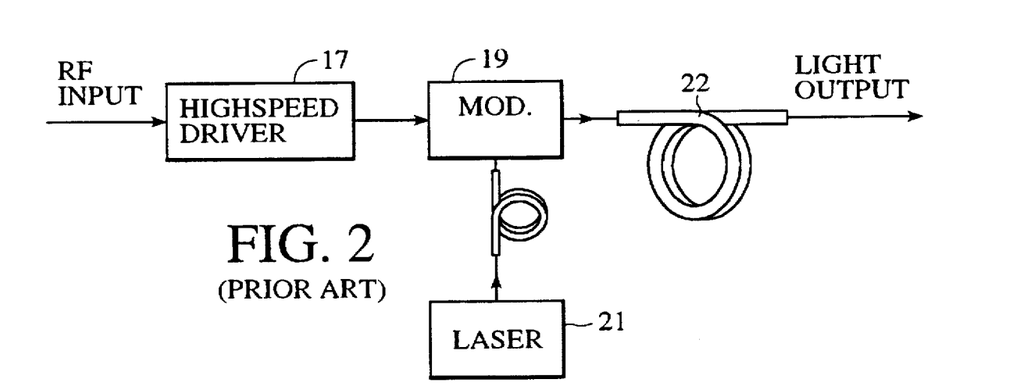
FIG. 2 is a block structure of an alternate prior art optical clock generator.

As shown in FIGS. 1 and 2, prior art high speed optical clock generators heavily rely on sophisticated and bulky high frequency electronic modulation circuits. In FIG. 1, a radio frequency electronic signal, RF, feeds into a high speed driver 11, which in turn drives a laser diode 13 connected to a fiber optic line 15. In FIG. 2, the outputs from an electronic high speed driver 17 and a laser diode 21 both feed into a modulator 19, which modulates the laser diode 21 in response to an RF signal and outputs the result on fiber optic line 22. Electro-optical circuits, such as those shown in FIGS. 1 and 2, suffer from low efficiency, high power consumption and low integration capabilities due to the intrinsic frequency limitations of electrical signals.

Figure 3:
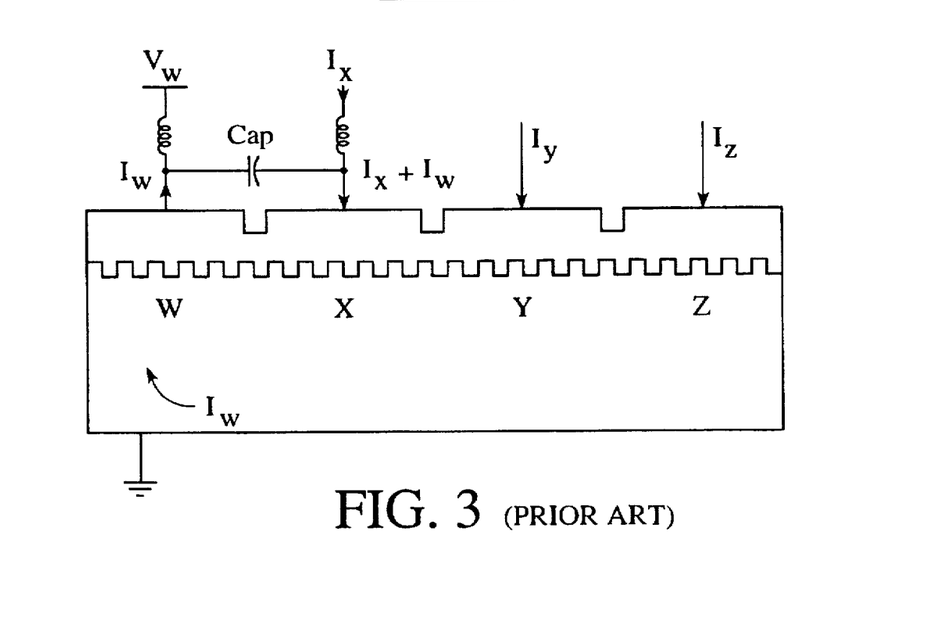
FIG. 3 is a prior art optical clock generator using electrical components in a feedback loop.

An example of an electrical-to-optical clock generator disclosed in the Aug. 13, 1992, vol. 28 issue of *Electronic Letters*, pages 1631–1633, written by Neophytou et al. is shown in FIG. 3. This photonic integrated circuit is made up of a four section distributed feedback laser. Section W is reversed biased with a voltage Vw. Sections X, Y and Z form a three section, self-pulsating laser with appropriate bias conditions, Ix, Iy and Iz. Distributed feedback reflectors are tunable by applying separate currents to each section of the laser so as to modulate the section's effective index of refraction electro-optically. A change in the index of refraction causes a change in the selectivity of its functional mode, center frequency. That is, the applied current causes a section to jump to a different axial mode. This is known as mode hop tuning. It is generally not possible for an applied current to affect only one section. Therefore, multiple control currents and feedback circuits are necessary to obtain stable and balanced oscillation.

The structure of FIG. 3 achieves self-pulsating operation by inter-mode interaction between the sections and by leaving section X unpumped to provide a saturable absorptive region within the laser cavity. The self-pulsation generates a photocurrent Iw in section W. This photocurrent passes through a high speed electrical feedback loop and is superimposed on the bias current of the absorber Ix. The result is positive opto-electronic feedback which reinforces oscillation at the natural frequency of the feedback loop. This frequency depends on the length of the electrical feedback loop and the value of capacitor Cap, resulting in limited tunability. A similar self-pulsating photonic IC is taught by U.S. Pat. No. 5,349,598 to Ouchi et al., and a self-pulsating laser is disclosed in U.S. Pat. No. 5,416,790 to Yodishi et al.

Figure 4:
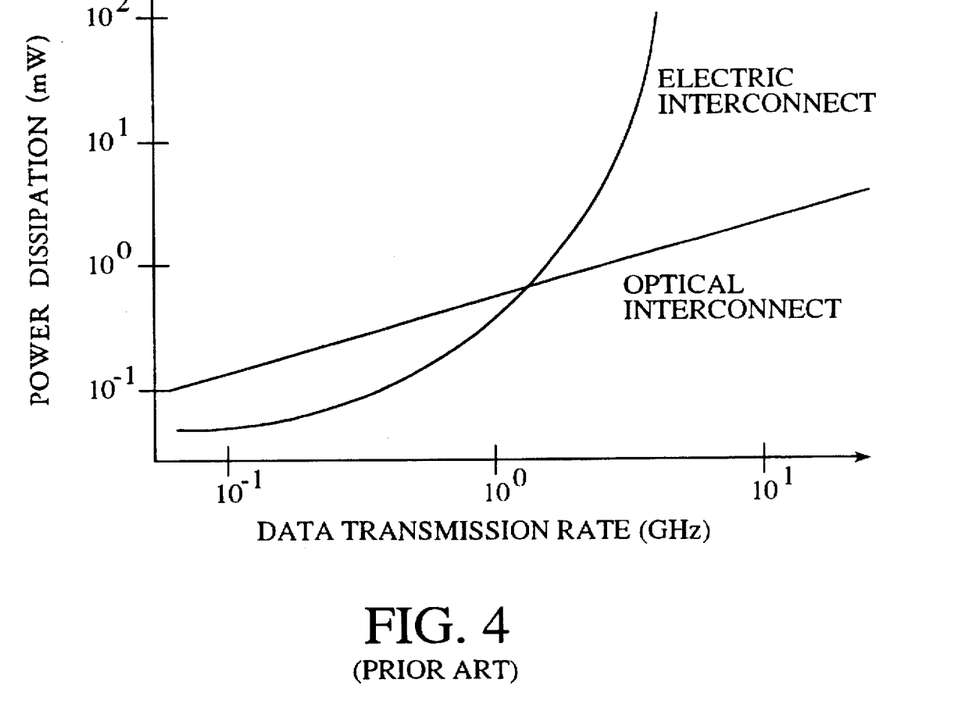
FIG. 4 is a plot of power dissipation versus maximum data transmission rate for optical and electronic interconnect.

The reliance of prior art optical clock generators, such as those of FIGS. 1–3, on electrical modulation makes them subject to the limitations of the electrical domain. Electrical signals suffer from fundamental chip-to-chip, module-to-module and board-to-board interconnect speed limitations. The electrical signal performance maximum is reached at 2 GHz for silicon chips and at 10 GHz for GaAs chips. This performance is further attenuated to 180 MHz at point-to-point board interconnections. Dependence on electrical modulation prevents an optical clock generator from taking advantage of the high GHz and even THz frequency capabilities of an all-optical photonic IC. For multi-GHz optical clock generation, electrically modulated optical systems also suffer from high power losses and interconnect distance degradation, as shown in FIG. 4, when frequent electrical-to-optical and optical-to-electrical conversions are required.

Additionally, as was explained with reference to FIG. 3, multiple current sources and proper balancing of the current sources are necessary for proper tuning of a prior art laser diode. In the area of solid state lasers, the non-linear Kerr effect of some materials has been used to generate sustained pulsation using only one constant pumping means after an initial perturbation of the resonant cavity by a second means. The self-focusing Kerr effect of some materials causes the effective gain of the material to be dependent on the optical intensity of a lightwave. The self-focusing results in a higher gain for a pulse operation than for a constant wave operation. U.S. Pat. No. 5,079,779 to Negus et al. teaches a titanium-sapphire solid state laser which uses the self-focusing Kerr effect to mode lock the laser. Negus et al. uses a laser diode to pump the solid state laser and then introduces an intensity fluctuation into the laser's resonant cavity, either by use of a flash lamp or by temporarily varying the length of the laser cavity by moving an end mirror. The intensity fluctuation causes a small intensity pulse within the cavity which is then amplified by the Kerr effect during subsequent round trips of the pulse until sustained self-pulsation is achieved. The solid state laser taught by Negus et al., however, has very limited tunability.

It is an object of the present invention to provide an optical clock generator requiring no electrical modulation means and having very high frequency generation (up to 100 GHz).

It is another object of the present invention to provide a photonic IC with self-sustained pulsation and a simple wide frequency tuning (up to 20–30%) mechanism which requires only the varying of an applied DC current.

It is another object of the present invention to provide a tunable photonic IC having one control current and improved stability.

It is another object of the present invention to provide a high frequency, all-optically-generated, tunable optical clock generator having an epi-structure geometry and which can be constructed using standard fabrication techniques commercially available for the construction of low cost CD laser diodes.

SUMMARY OF THE INVENTION

The above objectives are met in a photonic IC having a first and second in-plane laser stripe which have an overlap forming a vertical non-linear directional coupler, NLDC. The first laser stripe has an active region pumped by a DC current for lightwave generation and tuning. The second laser stripe has an end facet connected to a light reflector for establishing optical feedback. The light reflector preferably provides mode selective reflection for the tunable giga-hertz optical clock generator, TGOCG, of the present invention. The second laser stripe is in direct optical communication with the first laser stripe through the NLDC. In other words, the first stripe is an electrically pumped laser and the second stripe is an optically pumped laser.

The TGOCG is a GaAs optical semiconductor apparatus, and the non-linear effects of the NLDC come from the non-linear Kerr effect of GaAs and the design of the directional coupler itself. Because of the Kerr effect of the NLDC, the index of refraction of the NLDC varies with charge density, which is directly related to the intensity of a lightwave. The change in the index of refraction, in turn, varies the gain and phase shift of propagating lightwaves in both stripes. That is, the change in index of refraction induces a change in the temporal and spatial profile of lightwaves within the cavity. As a result, the fraction of light transferred from the first stripe to the second stripe depends on the input light intensity of the first stripe into the NLDC, as well as on the geometric structure of the NLDC. Similarly, the fraction of the light that bounces back from the second stripe to the first stripe likewise depends on the input light intensity. In effect, the NLDC forms an intensity-dependent external cavity of the semiconductor laser.

The TGOCG establishes self-sustained oscillation by taking advantage of the non-linear energy exchange between the two stripes and the interaction of relaxation oscillation in each stripe. Relaxation oscillation results from a change in the charge carrier density or photon density, and normally decays exponentially to zero. In the TGOCG, the relaxation oscillation of light intensity in each stripe is always interrupted by energy transfer from the other stripe, and the stripes thereby shift to undamped oscillation. In other words, the perturbation of the first stripe by the second stripe causes a change of phase and amplitude of the electric field in the first stripe, which forces a change of carrier density in the same stripe. The change of carrier density then changes the index of refraction which then cause a perturbation in the second stripe. Additionally, the dependence of the index of refraction on the varying charge density introduces a modulation of the phase shift between the laser stripes causing antisymmetric mode interaction which further aids in the establishment of the undamped oscillation. In this manner, both stripes are constantly interrupting their relaxation oscillation.

The above invention results in a tunable gigahertz optical clock generator which can be made to have intensity pulse clock frequencies ranging from a few multi-GHz to more than 100 GHz, and can have a tunable range of up to 20–30%. Tuning is accomplished simply by adjusting an applied DC current bias. This is achieved without the use of complex, bulky and frequency-limited electronic circuitry. Furthermore, the TGOCG is a photonic device having features similar to commercially available CD laser diodes and therefore does not need expensive and demanding sub-micron lithograph technology or require a large amount of wafer real estate.

BEST MODE FOR CARRYING OUT THE INVENTION

Figure 5:
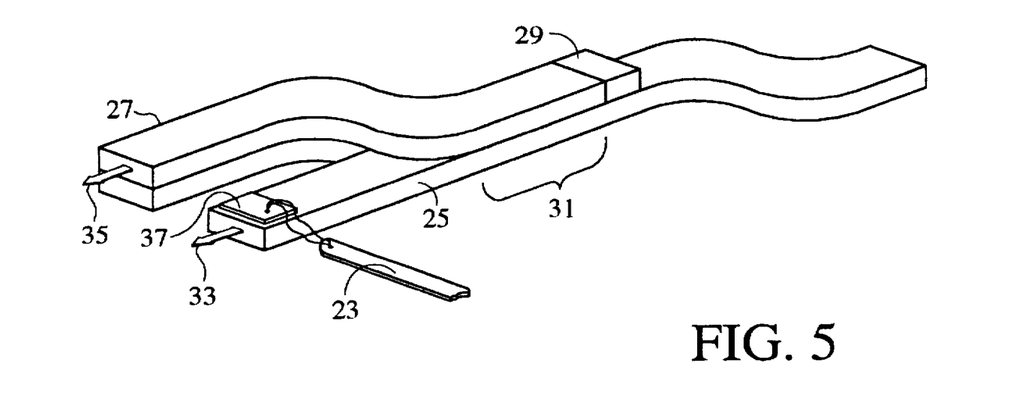
FIG. 5 is a tunable giga-hertz optical clock generator in accord with the present invention.

With reference to FIG. 5, the tunable giga-hertz optical clock generator, TGOCG, of the present invention forms a GaAs/AlGaAs multiple stripe laser preferably consisting of two waveguides 25 and 27 laid in an in-plane manner such that lightwaves 33 and 35 propagate within their respective waveguides 25 and 27 parallel to the substrate surface, not shown. The frequency of the TGOCG is adjusted by means of a single DC pumping current applied through an electrical conductor 23 to a low ohmic region 37 defining the active gain region of the TGOCG. A light reflector 29, such as a mirror or grated reflector, is placed at an end facet of waveguide 27 defining an end of a non-linear directional coupler 31. Preferably, the light reflector, 29, has mode selective capabilities such as, for example, a distributed Bragg reflector.

Figure 6:
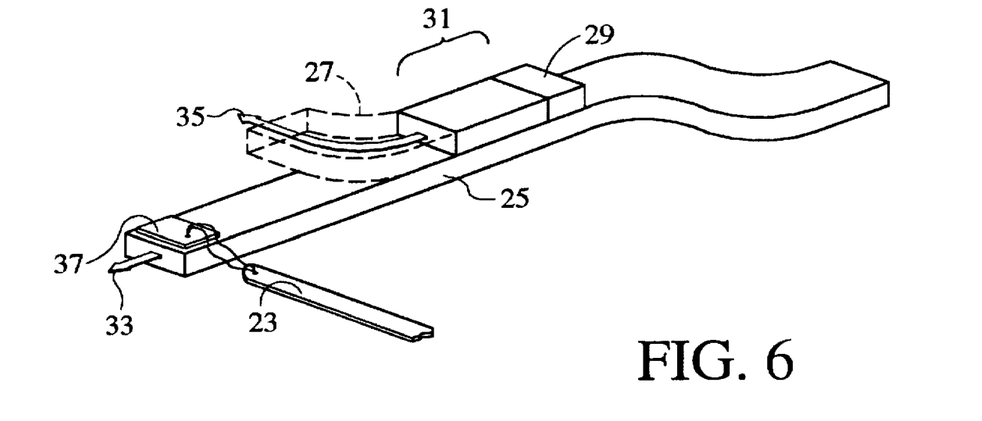
FIG. 6 is an alternate view of the present invention highlighting the non-linear directional coupler and reflector.

With reference to FIG. 6, the TGOCG of the present invention is based on the intrinsic nonlinear Kerr effect of GaAs/AlGaAs semiconductor lasers in combination with the integrated non-linear directional coupler NLDC 31. As explained below, the Kerr effect of the NLDC 31 modulates the line width enhancement factor, $\alpha$, causing changes in the amplitude-phase coupling of waveguides 25 and 27. It has been shown in "Injection Locking Properties of Semiconductor Lasers", by Roy Lang, IEEE, pp. 976–983 (1982) and "Relationship Between Carrier-Induced Index Change and Feedback Noise in Diode Lasers" by Donald M. Fye, IEEE, pp. 1675–1678 (1982), hereby incorporated by reference, that changes in $\alpha$ are the source of instability in laser diodes with external optical feedback and light injection. The cited references address the desired reduction of unintentional intensity relaxation oscillation within a laser diode which intrinsically develops whenever a laser diode undergoes a sharp change in its carrier density, such as by electrical modulation or optical feedback.

A simplified explanation of the cause of relaxation oscillation is as follows. As is known in the art, lasing conditions are established within a laser diode when an applied current in an active lasing region rises above a set threshold. As the current is increased, so is the amount of photon generation, that is, the light intensity. Because of the large difference in the lifetimes of photons and charge carriers, sharp changes in the carrier density can lead to spiking in the photon density and vice-versa. An increase in the carrier density causes an increase in the gain, which in turn increases the photon density. As the photon density increases and becomes positive with reference to the threshold, the growth in photon density causes a decrease in the carrier density through increased stimulated emission. As the carrier density decreases and becomes negative with reference to the threshold, the photon density also begins to decline. When the photon density becomes negative, the low photon emission once again causes the carrier density to increase and the cycle repeats itself. This interaction between carrier and photon densities due to a sudden change in the number of carriers or photons causes a natural resonance in the laser cavity which results in a ringing of the output power intensity of the laser. The relaxation frequency is similar to that of an RCL electrical circuit and is the result of an attempt by the photons and carriers to relax to their steady-state values.

In the TGOCG of the present invention, lasing conditions in waveguide 25 are established by applying a current through electrode 23 over active region 37. When the applied current rises above a set threshold, a laser beam 33 is established which propagates towards the NLDC 31. At the NLDC 31, a partial energy transfer between waveguides 25 and 27 takes place, thus generating another laser beam 35 within the NLDC 31 which is reflected back by the light reflector, or end mirror, 29. In effect, waveguide 25 is an electrically pumped laser, and waveguide 27 is an optically pumped laser. A discussion of the critical factors to be considered in the design of the TGOCG is set forth in greater detail below.

Because of the Kerr effect of GaAs/AlGaAs, the index of refraction in the NLDC 31 varies with temporal local light intensity. Therefore, the fraction of light transferred from one waveguide to the other depends on the input light intensity, as well as on the geometric structure of the NLDC 31. Furthermore, the fraction of the light that bounces back also depends on the input light intensity itself. Therefore, the NLDC 31 is an intensity-dependent external cavity of the semiconductor laser. As further explained below, the intensity dependent index of refraction in essence modulates the gain of the NLDC 31 and the phase shift of lightwave 33 and 35 leading to sustained oscillation which does not depend on the presence of a saturable absorber in the laser cavity. Changes in the phase shift can be understood by noting that changes in the carrier dependent index of refraction results in a change in the optical path length of the laser cavity.

Highly stable operation is achieved through the use of a vertical twin-stripe laser consisting of waveguides 25 and 27. The field of one stripe is perturbed by evanescent wave emanations from the other stripe. Essentially, each laser cavity becomes a complementary external cavity to the other. For example, a perturbation in stripe 25 from stripe 27 causes a change in the phase and amplitude of the field in stripe 25, which affects a change of carrier density in stripe 25. The change of carrier density in stripe 25 then causes a perturbation in stripe 27. Therefore, relaxation oscillation of light intensity in each stripe is always interrupted by the signal from the other stripe and thereby establishes undamped intensity oscillation. Generally, it is difficult to stabilize a device with two active oscillators. The present invention avoids this problem by using only one active oscillator in combination with the non-linear direction coupler 31. In essence, stripe 25 forms a master oscillator, and stripe 27 forms a slave oscillator. In FIGS. 5 and 6, the slave oscillator 27 is shown atop the master oscillator 25, but the vertical order of stripes 25 and 27 may be interchanged. This is not crucial to the invention.

The tuning mechanism is also based on the intrinsic optical nonlinearity of GaAs/AlGaAs semiconductor lasers (Kerr type materials). The pulsation frequency is established by the peculiar dispersion characteristics involving the intrinsic resonance between the photon and carrier densities, as well as the change in phase shift. Therefore, the pulsation frequency is controlled by the drive current with an increase in the drive current resulting in a higher pulsation frequency. Ultra-wide bandwidth from a few multi-GHz to greater than 100 GHz are derived from the DC-biased TGOCG laser under certain design criteria. The TGOCG can achieve a tunable range of as much as 20–30% by tuning the pumping current.

Lastly, because of its intrinsic high frequency features, the TGOCG does not use sub-micron lithography technology or require a large amount of wafer real estate. In fact, it requires only low cost GaAs fabrication technology with 5–10 μm geometry features. The fabrication of TGOCG is comparable to the technologies that are extensively used in the fabrication of standard CD laser diodes.

Figure 7:
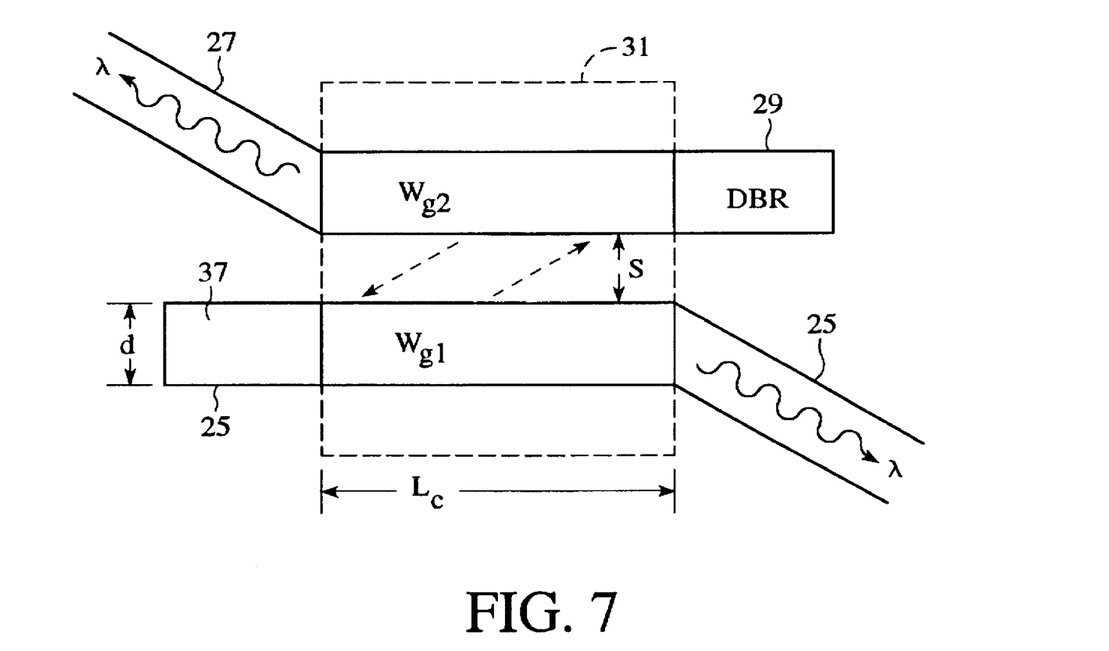
FIG. 7 is a block structure of the tunable giga-hertz optical clock generator in accord with the present invention.

The dynamic behavior of the TGOCG is analyzed with reference to FIG. 7. For clarity, FIG. 7 reduces the TGOCG to a symbolic block structure showing stripe 25 as it intercepts the active region 37 and NLDC 31. The reflector 29, preferably with mode selective capabilities, is shown coupled to one end of stripe 27 at an end facet terminating the NLDC 31. The distance between stripes 25 and 27 is designated by the reference character S and the stripe thickness by the reference character d. Furthermore, within the NLDC 31, stripes 25 and 27 are also designated as waveguide 1, Wg1, and waveguide 2, Wg2, respectively, and the field coupling between the two waveguides Wg1 and Wg2 is represented by diagonal dashed arrows.

Since the TGOCG is composed of two lasers and the stimulated emission in the laser cavities is dominated by the carrier density, a rate equation will be used to describe the time-dependent behavior of the carrier density and combined into the coupled-mode theory-based coupled equations. The coupled-mode theory can be used to analyze wave propagation and energy transfer in complicated guiding structures where the structure can be separated into several simple elements. Wave propagation can be described by the respective mode or modes in each individual element and the interaction between them is described by the coupled-mode theory.

Looking at only one laser stripe, to analyze the interaction between injected charge carriers and the resultant generation of photons in a semiconductor laser, it is necessary to write down the rate equations for both the carrier density and the light intensity. For a single narrow stripe semiconductor laser, the rate equation for the carrier density is:

$$\frac{dN}{dt} = \frac{J}{e \cdot d} - \frac{N}{\tau_s} - G(N) \cdot I \quad (1)$$

where N is the carrier density, J is the pump current density, e is the charge of an electron, d is the thickness of the gain region (also called active region), $\tau_s$ the carrier lifetime (due to spontaneous emission), G is the optical gain (which depends on the carrier density) and I is the average light intensity in the laser cavity. At the right-hand side of this equation, the first term is the pump rate, the second term is the loss rate from spontaneous emission and the third term is the loss rate from the stimulated emission. The rate equation of the light intensity in the laser cavity, assuming a single longitudinal mode, is:

$$\frac{dI}{dt} \left[ G(N) - \frac{1}{\tau_p} \right] \cdot I \quad (2)$$

where $\tau_p$ is the photon life time (due to the absorption and reflection loss in the laser cavity). Although a small portion of the light from spontaneous emission may be injected into the same laser mode, spontaneous emission is generally neglected because of its infinitesimal contribution to a lasing mode intensity. From the rate equation for the intensity (2), we can obtain the related equation for the complex electrical field in the laser cavity:

$$\frac{dE}{dt} = \frac{1}{2}\left[ G(N) - \frac{1}{\tau_p} \right] \cdot E \quad (3)$$

where E represents the electric field.

The above three equations are the equations used to discuss the dynamics of single stripe semiconductor lasers. For more complex cases, like laser arrays and multiple stripe interactions, the variation of the phase of the field has to be considered. A detailed derivation of the coupled-mode equations of laser arrays as they apply to the present invention is now given.

From the Maxwell wave equation, we have the following expression:

$$\mu_0\epsilon_0\frac{d^2E}{dt^2} + \mu_0\sigma\frac{dE}{dt} - \nabla^2 E(r,t) = -\mu_0\frac{d^2P}{dt^2} \quad (4)$$

where E is the electric field, P is the material polarization, and the second term with σ represents the loss in the laser cavity. Because the present invention preferably uses a mode selective reflector 29, we only consider the variation of the fundamental mode such that Eq. (1) is a scalar equation and not a vector equation.

The electric field is a function of displacement, r, and time, t, and the net electric field in the TGOCG can be approximated by the sum of the unperturbed fields in each waveguide:

$$E(r,t) = A(t) \cdot E_1(r)e^{i\omega t} + B(t) \cdot E_2(r)e^{i\omega t} \quad (5)$$

where ω is the lasing frequency, i.e. the central frequency of light emitted from the laser, and $E_1$ and $E_2$ are the electric field distributions of the fundamental mode of each waveguide 1 and 2, respectively taken alone, and further satisfy Helmholtz equation. A(t) and B(t) are the time dependent amplitudes of the modes in waveguides 1 and 2, respectively.

The total medium polarization within the non-linear directional coupler 31 can be taken as the sum of the initial polarization due to an initial, fixed refractive index and a perturbance in the initial polarization due to a change in the charge density and the dependence of the refractive index on the charge density. That is:

$$P(r,t) = P_0(r,t) + P_{pert}(r,t) \quad (6)$$

where $P_0$ is the polarization induced by the fixed distribution of the refractive index in the coupled waveguides, and $P_{pert}$ is the change of polarization induced due to the variation of the charge carrier density in the laser cavity. To simplify Maxwell's wave equation (4), $P_0(r,t)$ can be further broken down to the sum of $P_{01}$, $P_{02}$ and $P_c$, i.e.:

$$P(r,t) = P_{01}(r,t) + P_{02}(r,t) + P_{pert}(r,t) + P_c(r,t) \quad (7)$$

where $P_{01}$ and $P_{02}$ are the polarizations corresponding to a single waveguide alone, and $P_c$ corresponds to the energy coupling between the two semiconductor lasers of the TGOCG.

Within waveguide 1, the contribution of the electric field component $E_2$ of waveguide 2 to the total electric field within waveguide 1 is much smaller than the contribution of $E_1$ due to waveguide 1 itself. Eq. (4) may therefore be simplified to:

$$\epsilon\frac{d^2AE_1e^{i\omega t}}{dt^2} + \sigma\frac{dAE_1e^{i\omega t}}{dt} - \frac{1}{\mu_0}\nabla^2 AE_1e^{i\omega t} = \quad (8)$$

$$-\frac{d^2P_{pert}}{dt^2} - \frac{d^2P_{ct}}{dt^2}$$

In the above equation, second properties have been used. First, the term including $P_{01}$ has been combined with the first term in the left hand side of Eq. (8). Second, we have used:

$$\epsilon_0 B(t)\frac{d^2E_2e^{i\omega t}}{dt^2} + \sigma B(t)\frac{dE_2e^{i\omega t}}{\mu_0} - \frac{B(t)}{\mu_0}\nabla^2 E_2e^{i\omega t} = -\frac{d^2P_{02t}}{dt^2} \quad (9)$$

A measure of the field coupling between the waveguides can then be obtained by multiplying Eq. (8) by $E_i$, integrating over all space and dividing by $E_1(r)E_2(r)dr$, we can write Eq. (8) as:

$$\frac{d^2A(t)e^{i\omega t}}{dt^2} + \frac{\sigma}{\epsilon}\frac{dA(t)e^{i\omega t}}{dt} + \Omega^2 A(t)e^{i\omega t} = \quad (10)$$

$$-\frac{1}{\epsilon}\frac{d^2P'_{pert}(t)e^{i\omega t}}{dt^2} - \frac{2c\,\kappa_{12}}{n\omega}\frac{d^2B(t)e^{i\omega t}}{dt^2}$$

where $$\kappa_{12} = \frac{\omega}{2cn}\frac{\int_v [n_c^2(r) - n_2^2(r)] E_2(r) \cdot E_1^*(r)dr}{\int_v E_1(r) \cdot E_1^*(r)dr} \quad (11)$$

is the coupling coefficient, n is the index of refraction and Ω is the resonance frequency.

Applying the slowly varying envelope approximation (SVEA), A(t)exp(iωt) and B(t)exp(iωt) can be represented by $a_1(t)\exp[i(\omega t-\phi_1(t))]$ and $a_2(t)\exp[i(\omega t-\phi_2(t))]$, where $\phi_1$ and $\phi_2$ are the phase shifts corresponding to a change in the real part of the index of refraction. Therefore, Eq. (10) can be simplified to:

$$i\omega\frac{da_1(t)}{dt} + \omega\frac{d\phi_1(t)}{dt}a_1(t) + \frac{i\omega\gamma}{2}a_1(t) + \frac{(\Omega^2 - \omega^2)}{2}a_1(t) = \quad (12)$$

$$-\frac{\omega^2}{2\epsilon}P'_{pert}(t) + \frac{\omega c\,\kappa_{12}}{n}a_2(t)e^{-i(\phi_2-\phi_1)}$$

where γ=σ/ε is the loss coefficient of photon energy in the laser cavity. $P'_{pert}$, the slowly varying envelope of the polarization, can be represented by the change in the real and imaginary part of index of refraction as:

$$P'_{pert} = 2n\epsilon_0(\Delta n_r + i\Delta n_i)a_1 \quad (13)$$

Because the lasing frequency ω is close to the resonance frequency Ω, the fourth term of Eq. (12) can be replaced by $\omega(\Omega-\omega)a_1$. The imaginary part and real part of Eq. (12) can be written as:

$$\frac{da_1(t)}{dt} + \frac{\gamma}{2}a_1(t) = \frac{\omega}{n}\Delta n_i a_1 - \frac{c\kappa_{12}}{n}a_2(t)\cdot\sin(\phi_2 - \phi_1) \quad (14)$$

and

-continued $$\frac{d\phi_1(t)}{dt} + (\Omega - \omega) = \frac{\omega}{n} \Delta n_r + \frac{c\kappa_{12}}{n} \cdot \frac{a_2(t)}{a_1(t)} \cos(\phi_2 - \phi_1) \quad (15)$$

respectively. It has been shown in "Theory of the Linewidth of Semiconductor Lasers", by C. H. Henry, *IEEE*, pages 259–264 (1982), hereby incorporated by reference, that $\Delta n_r$ of GaAs are proportional to the minority carrier density, and the ratio between them can be represented as:

$$\alpha = -\left(\frac{\Delta n_r}{\Delta n_i}\right)_{N=N_{th}} \quad (16)$$

where N is the carrier density and $N_{th}$ is the carrier density at the threshold condition. The linewidth enhancement factor, $\alpha$, is a material-dependent constant. Because of the index of refraction, n, the first terms on the right-hand side of Eqs. (14) and (15), which represent the gain and phase shift in the laser cavity, are proportional to the carrier density around the threshold condition. We therefore have the following relations:

$$\frac{\omega}{n} \Delta n_i = \frac{1}{2} \left[ G(N_{th}) + g(N - N_{th}) \right] \quad (17)$$

and $$\frac{\omega}{n} \Delta n_r = \Delta \omega_0(N_{th}) - \frac{g\alpha}{2} (N - N_{th}) \quad (18)$$

where G, a bias term, is the carrier-dependent gain of the intensity in each time unit and $$g = \left(\frac{\delta G}{\delta N}\right)_{N=N_{th}}$$

is the differential gain around the threshold condition. Note the gain is defined here as the gain of the light intensity and not the gain of the field, so there is a factor of ½ in each of the above two equations.

From the definition of the threshold condition, the gain at threshold condition $G(N_{th})$ is exactly equal to the loss $\gamma$. On the other hand, the constant phase shift at the threshold condition, $\Delta\omega_0(N_{th})$, has the same value in every stripe. Because only the difference of the phases between neighboring stripes can affect the amplitudes and phase differences, the arbitrary constant phase shift $\Delta\omega_0(N_{th})$ can be neglected or absorbed into $\omega$, as well as the second term on the left-hand side of Eq. (14). Therefore, Eq. (14) and Eq. (15) can be rewritten as:

$$\frac{da_1(t)}{dt} = \frac{g}{2} (N - N_{th})a_1 - \frac{c\kappa_{12}}{n} a_2(t) \cdot \sin(\phi_2 - \phi_1) \quad (19)$$

and $$\frac{d\phi_1(t)}{dt} = -\frac{g\alpha}{2} (N - N_{th}) + \frac{c\kappa_{12}}{n} \cdot \frac{a_2(t)}{a_1(t)} \cos(\phi_2 - \phi_1) \quad (20)$$

For the TGOCG, because there are only two lasers, Eq. (19) and Eq. (20) can be generalized to:

$$\frac{da_i}{dt} = \frac{g'}{2} (N_i - N_{th})a_i - \quad (21)$$

$$\frac{\kappa c}{n} [a_{i+1}\sin(\phi_{i+1} - \phi_i) + a_{i-1}\sin(\phi_{i-1} - \phi_i)]$$

$$\frac{d\phi_i}{dt} = -\frac{\alpha g'}{2} (N_i - N_{th}) + \quad (22)$$

$$\frac{\kappa c}{n} \left[ \frac{a_{i+1}}{a_i} \cos(\phi_{i+1} - \phi_i) + \frac{a_{i-1}}{a_i} \cos(\phi_{i-1} - \phi_i) \right]$$

Equations (21) and (22) are the time dependent coupled-mode equations. For simplicity, the contribution of spontaneous emission into the lasing mode and lateral variations of the optical field are neglected in these two equations. As a basis for Eq. (21) and (22), the following set of assumptions need to be made. It is assumed that each laser of the TGOCG can only support one transverse mode and one longitudinal mode at a time. Since the TGOCG has a mode selective reflection mirror 29 at the end of the laser cavity, the above assumption is acceptable. These two modes are the same for all stripes.

Since our objective is to solve the dynamics of the TGOCG, the variation of carrier density has to be taken into account. Assuming the pump current is not much higher than the threshold current, the variation of carrier density in each stripe can be represented by a carrier density equation:

$$\frac{dN_i}{dt} = \frac{J}{ed} - \frac{N_i}{\tau_s} - \Gamma g'(N_1 - N_{th})a_i^2 \quad (23)$$

where J is the pump current, e is the charge of an electron, d is the thickness of the active layer, and $\Gamma$ is the mode confinement factor and is defined as the ratio between the light intensity in the pumped region and the total light intensity in the cavity. The first term on the right-hand side of Eq. (23) can be replaced by P, where P=J/ed is the pump rate.

Finally, the temporal behavior of the TGOCG with evanescent coupling is described by the following equations:

$$\frac{dE_i}{dt} = \frac{g'}{2} (N_i - N_{th})E_i - \quad (24)$$

$$\frac{\kappa c}{n} [E_{i+1}\sin(\phi_{i+1} - \phi_i) + E_{i-1}\sin(\phi_{i-1} - \phi_i)]$$

$$\frac{d\phi_i}{dt} = -\frac{\alpha g'}{2} (N_i - N_{th}) + \quad (25)$$

$$\frac{\kappa c}{n} \left[ \frac{E_{i+1}}{E_i} \cos(\phi_{i+1} - \phi_i) + \frac{E_{i-1}}{E_i} \cos(\phi_{i-1} - \phi_i) \right]$$

$$\frac{dN_i}{dt} = P - \frac{N_i}{\tau_s} - \left( \frac{1}{\tau_p} + g'(N_i - N_{th}) \right) E_i^2 \quad (26)$$

where $\tau_p = 1/\gamma$ is the photon lifetime.

The electric field Eq. (24) and charge density Eq. (26) can be applied to both waveguides, 25 and 27. Thus, there are five partial differential equations to describe the TGOCG. Two represent the dynamic behavior of the electric fields in each waveguide, two more represent the charge densities in each waveguide, and the fifth, based on Eq. (25), defines the phase difference between the two laser stripes.

A stability analysis of equations (24)–(26) would be difficult for a large number of waveguides, N, but the TGOCG design uses only two channel waveguides. Therefore, a closed-form expression for the stability boundaries is readily obtained. In order to analyze and numerically simulate the five equations, the equations first need to be normalized. We therefore introduce the following normalized variables and parameters:

$$X_i = (\frac{1}{2}g'\tau_s)^{1/2}E_i$$

$$Z_i = (\frac{1}{2})g'N_{th}\tau_p(N_i/N_{th}-1)$$

$$p = (\frac{1}{2})g'N_{th}\tau_p(P/P_{th}-1) \quad (27)$$

$$\eta = (\kappa c/n)\tau_p$$

$$T = \tau/\tau_p$$

Then, for a two element laser array, the coupled-mode equations become:

$$\dot{X}_1 = Z_1 X_1 - \eta X_2 \sin\theta$$

$$\dot{X}_2 = Z_2 X_2 - \eta X_1 \sin\theta$$

$$\dot{\theta} = -\alpha(Z_2 - Z_1) + \eta(X_1/X_2 - X_2/X_1)\cos\theta \quad (28)$$

$$\dot{T}_{Z_1} = p - Z_1 - (1 + 2Z_1)X_1^2$$

$$\dot{T}_{Z_2} = p - Z_2 - (1 + 2Z_2)X_2^2$$

where $\Theta = \phi_2 - \phi_1$ and the dots signify derivatives with respect to a reduced time $t/\tau_p$. These five coupled equations are the final results which were used in the analysis of the dynamic behaviors of the TGOCG.

At a steady state, the time derivatives of all five variable in Eq. (28) must be zero. This gives two physically meaningful steady states. One is the in-phase steady state where $\phi_2 - \phi_1 = 0$, and the other is the out-of-phase state where $\phi_2 - \phi_1 = \pi$. The stability of the steady state can be analyzed by determining the conditions under which small fluctuations decay to zero exponentially with time. To investigate this, equations (28) are first linearized by expanding them to first order around the steady state and ensuring that all small perturbed variables decay to zero after a perturbation. This can be ensured using Routh's criterion and forcing all Eigen values of M to be negative. By using Routh's criterion, the following stability conditions were achieved, $$\eta < \alpha p/(1 + 2p) \quad (35)$$

for in-phase state, and $$\eta > (1 + 2p)/2\alpha T \quad (36)$$

for out-of-phase state.

Figure 8:
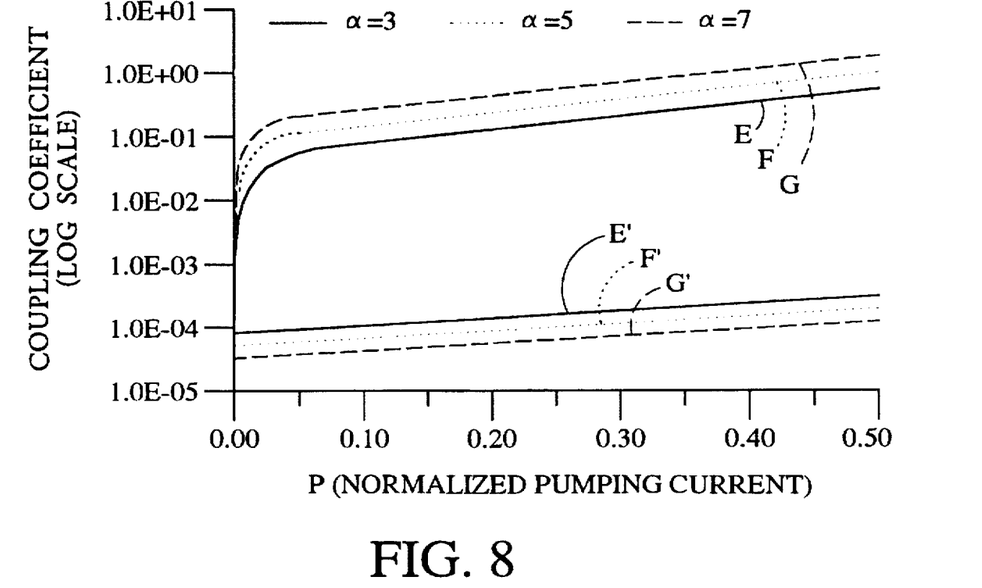
FIG. 8 is a plot of coupling coefficient versus normalized pumping current outlining the stable and unstable regions of the present invention for different values of linewidth enhancement factor, $\alpha$.

With reference to FIG. 8, the stability regions, as defined by Eqs. (35) and (36), for three different α values of 3, 5 and 7 are plotted with solid E-E' lines, dotted F-F' lines and dashed G-G' lines, respectively. The area above lines E, F and G designate the in-phase stable region where the coupling strength η is high and the two laser stripes are so closely coupled that they behave as one laser in phase. The area below lines E', F' and G' designate the out-of-phase stable region where the coupling strength η is small and the two laser stripes are so loosely coupled that they behave as if they were essentially independent. The region in between lines E, F, G and lines E', F', G', respectively, define a large area in which the two stripes are phase-locked in a non-linear unstable (oscillation) region.

In the unstable region, the laser arrays exhibit sustained oscillation. Two important phenomena induce the instability. First is the strong relaxation oscillation which comes from the large difference between the carrier lifetime and photon lifetime, i.e. a very large T. Second is the amplitude-phase coupling through the line width enhancement factor α, which as stated earlier has been shown to be the source of instability of lasers with feedback and light injection. In a first stripe, a perturbation from a second stripe causes a change of the phase and amplitude of the field in the first stripe, which affects a change of the carrier density in the same stripe. Therefore, the relaxation oscillation of light intensity in each stripe is always interrupted by the signal from the other stripe and the oscillation thereby shifts to undamped oscillation. The linewidth enhancement factor α, can make the situation worse. With α, the change of the carrier density can affect the phase relation between the two stripes. Since the change of the carrier density is much slower than the change of the electric field, the perturbed carrier density needs a much longer time to reach steady state than the perturbed electric field. Even if the perturbed electric field can reach a stable state in a short time, the carrier density, through α, can still directly affect the phase relation and break the chance of approaching the steady state of the electric field.

When the TGOCG is within a region of sustained oscillation, in the first few nanoseconds the light intensity will start with a few strong spikes where the lasers are dominated by the strong relaxation oscillation. Since the semiconductor lasers have a large time constant, the ratio between the lifetime of a charge carrier and a photon, the first few light intensity spikes are very strong before it reaches a stable oscillatory state. After the first few strong spikes, the light intensities from the lasers reach sustained spiking at a smaller amplitude. Since the outputs from each single stripe laser always approach stable states, the unstable results are induced by the strong coupling effects between the two laser stripes. Since the coupling energy from one stripe is always perturbing the dynamic condition in the other stripe, the light intensity in the second stripe is not able to reach a stable state before the perturbed energy arrives from the first stripe. Therefore, light intensities in both stripes achieve sustained oscillation.

The temporal behavior of the normalized carrier densities in the laser, which are based on the threshold carrier density, can be negative after a strong positive intensity peak. This means that the stimulated emission is so strong that most of the carriers in the conduction band relax to the valence band and release most of the energy in the conduction band in a short period. The variation of carrier density is much smaller than that of light intensity, since the stimulated emission can be very large with even a small amount of variation of carrier density. The phase difference will oscillate, representing the energy transfer between the two stripes. This effect is dominated by the variation of index of refraction in the two laser stripes. Since the TGOCG is operated in a very strong coupling region, the phase difference oscillates within $-\pi$ and $+\pi$. The variation of index of refraction causes a delay of energy transfer among the two stripes and thereby the phase shift.

Figure 9:
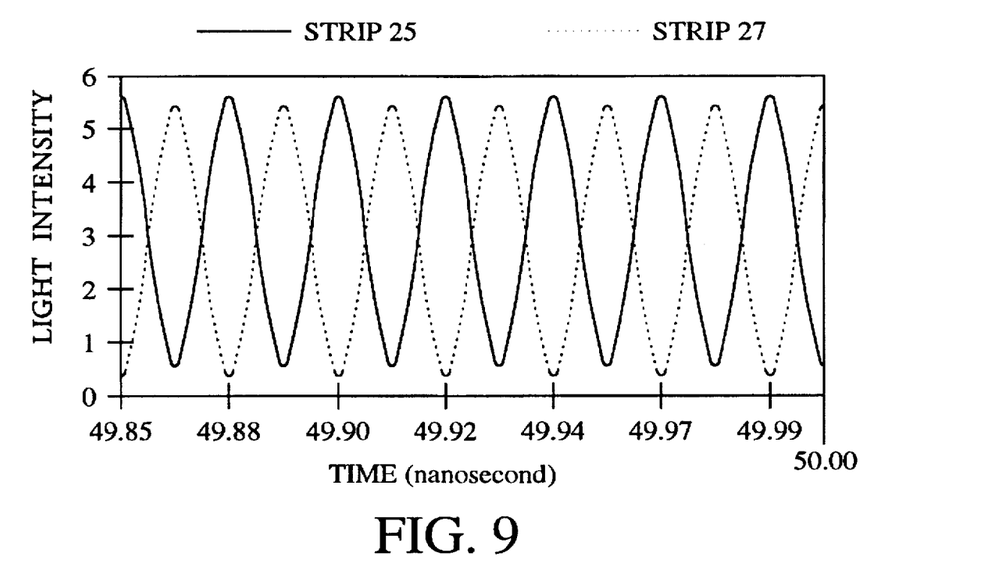
FIG. 9 is a plot of energy transfer between two waveguides of a non-linear directional coupler in accord with the present invention.

An example of energy exchanged in the NLDC under optimized sustained oscillation conditions is shown in FIG. 9 with the normalized coupling strength, η, having a value of $10^{-0.95}$. The solid line is the output intensity from waveguide 1, and the dashed line is the output from waveguide 2. Energy exchange between the two waveguides is clearly shown.

Within the non-linear unstable region, however, stable oscillation can be sustained only within a range of pumping current values. For pumping current less than p=1.0, the spectrum may exhibit some other frequency components at its low band side and its high band side. In terms of temporal behavior, the low frequency components manifest themselves as a low frequency envelope encompassing the high frequency components. With more reduced pumping current, the low frequency envelope gradually dominates the temporal behavior and finally decays to a steady state. That is, with reduced pumping current, the TGOCG tends to reach a steady state.

Since the periodic oscillation cannot exist in very high current nor in very low current, there is a limited current range for optimum periodic oscillation for different coupling coefficients or strengths, η. By investigating the pumping current range of different coupling coefficients η, we can identify the frequency tuning range having high frequency oscillation.

Figure 10:
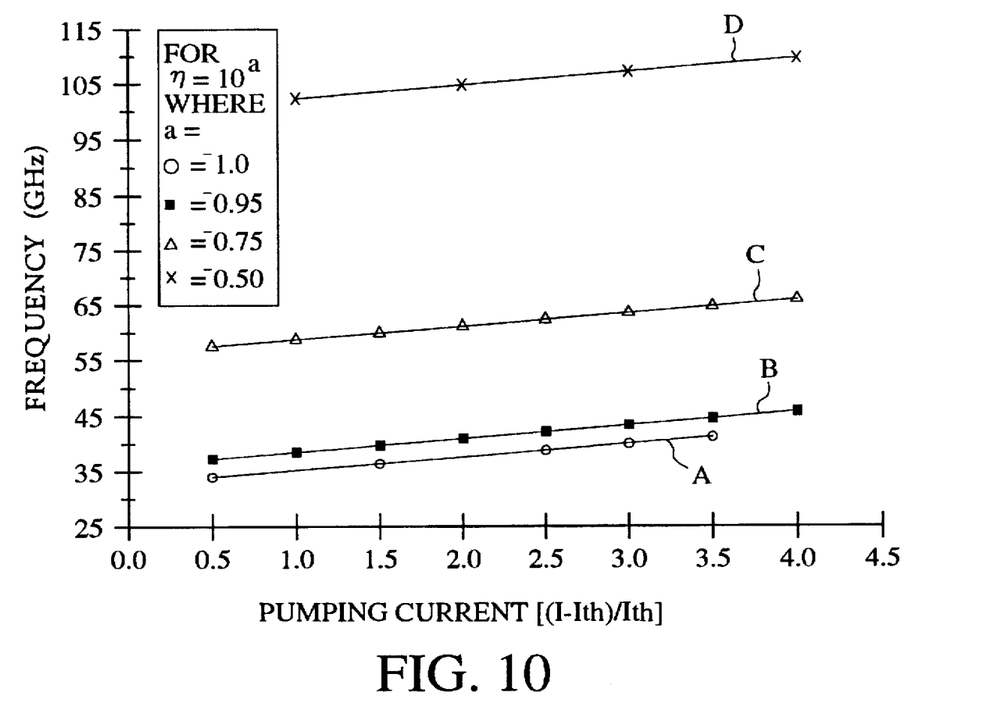
FIG. 10 is a plot of the tunable range of a TGOCG in accord with the present invention for different values of normalized coupling strength, $\eta$.

As shown in FIG. 10, ultra-wide tunable bandwidths from a few multi-GHz to greater than 100 GHz are achievable through simple DC-biasing of the TGOCG laser chip. The frequency generation strongly depends on the normalized coupling strength, η. Clock frequency is shown to span from a few GHz to more than 100 GHz by adjusting the coupling strength η, from $10^{-1.0}$ to $10^{-0.5}$. Additionally, the FWHM of the spectra can be as sharp as a few 100 MHz. As shown by line A, $\eta=10^{-1.0}$ results in a tunable frequency range from 34 GHz to 42 GHz by adjusting the DC pumping current. For $\eta=10^{-0.95}$, line B shows a tunable frequency range from 38 GHz to 46 GHz. Although not completely shown in FIG. 10, line C has a significant tunable frequency range from 58 GHz to 69 GHz with $\eta=10^{-0.75}$, and line D shows a tunable frequency range from 102 GHz to 106 GHz obtained with $\eta=10^{-0.5}$.

The most important parameters which affect the oscillation frequency are the coupling coefficient η and pumping current p. The coupling coefficient η is determined by the geometric structure of the device and is the dominant parameter for oscillation frequency. However, this parameter is difficult to be modulated after the device dimensions have been determined. Therefore, the second parameter, the pumping current p, becomes the key factor for dynamic optimization.

The normalized coupling strength, η, is a strong function of device structure and material characteristics. In order to design the epi-wafer and device structure, the corresponding physical parameters of the NLDC high speed clock generator can be transferred from the normalized coupling strength, η. The coupling coefficient is related to the physical dimension and semiconductor material of the TGOCG. The normalized pumping current can likewise be transferred to the physical current density. Another physical parameter which is required is the index of refraction of the material of the semiconductor lasers and the laser wavelength. Since we have selected GaAs/AlGaAs to be the lasing material, the index of refraction, n, in the GaAs active layer, is 3.6 and the wavelength of the laser in vacuum, λ, is 0.85 μm.

The normalized coupling constant η has to be transferred to the physical coupling constant κ. The relation between the physical coupling constant and normalized coupling constant is:

$$\eta = (\kappa c/n)\tau_p$$

where κ is the physical coupling constant, η is the normalized coupling coefficient, n is the index of refraction, c is the speed of light, and $\tau_p$ is the photon lifetime in the laser cavity. With n=3.6, c=300 mm/ps, $\tau_p$=1.0 ps and η=0.3, we have κ=360 (l/m). Based on the available coupling constant κ, we can then calculate the index of refraction n, active layer thickness of NLDC waveguide, d, and then use these two parameters to calculate the propagation constant, and the spacing, S, between the two laser stripes. The relation between the physical pumping current, P, and the normalized pumping current, p, is:

$$p = 0.5 \cdot g \cdot N_{th} \cdot t\left(\frac{P \cdot \tau_s}{N_{th}} - 1\right)$$

where g is the value of differential gain, $N_{th}$ is the threshold carrier density and $\tau_s$ the carrier lifetime. Finally, based on the required difference of the index of refraction, we can get the composition x of cladding layer $Al_xGa_{1-x}As$ between the two stripes.

In order to design the epi-wafer and device structure of a NLDC in accord with the present invention, first a tunable range and its corresponding normalized coupling strength η is selected. Then the corresponding physical parameters of the selected NLDC high speed clock generator can be transferred from the normalized coupling strength, η. Below is an example of the device structure of a NLDC in accord with the present invention and a selected normalized coupling strength of $\eta=10^{-0.75}$ for a tunable range of 58 GHz to 69 GHz as shown in line C of FIG. 10. All the physical parameter based on the required η are summarized in Table 1 below. As shown in the table, the TGOCG laser stripe width is a few micron wide, which does not required low yielding, high cost sub-micron lithography techniques. Essentially, this is the typical dimension for a commercially available CD laser.

TABLE 1

PHYSICAL PARAMETERS OF TGOCG DEVICE

| PHYSICAL PARAMETER | SYMBOL | $\eta = 10^{-0.75}$ | UNITS |
|---|---|---|---|
| Threshold Current Density | J | 24.0 | $\mu A/\mu m^2$ |
| Active Layer Thickness | d | 0.4 | μm |
| Carrier Lifetime | $\tau_s$ | 2.0 | ns |
| Photon Lifetime | $\tau_p$ | 1.0 | ps |
| Threshold Carrier Density | $N_{th}$ | $1.0 \times 10^{18}$ | l/cm³ |
| Index of Refraction | n | 3.6 | |
| Coupling Constant | κ | 0.00036 | l/μm |
| Differential Gain | g | 0.856 | $\mu m^3/ps$ |
| Linewidth Enhancement Factor | α | 5.0 | |
| Laser Wavelength | λ | 0.85 | μm |
| Width of Laser Stripe | W | 3.0 | μm |
| Spacing between Two Stripes | s | 0.55 | μm |
| Difference of Index of Refraction | Δn | 0.22 | |
| Composition Ratio of $Al_xGa_{1-x}As$ | x | 0.45 | |

Figure 11:
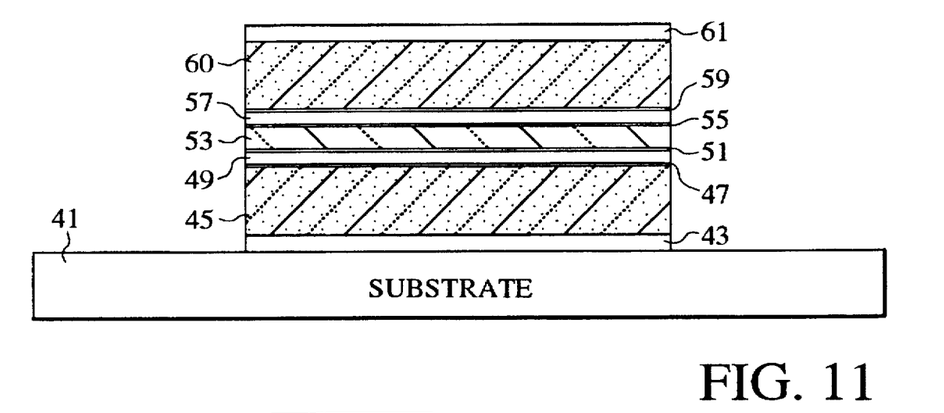
FIGS. 11–16 are process steps for the construction of a tunable optical clock generator in accord with the present invention.

With reference to FIG. 11, the construction of the TGOCG in accord with the present invention begins with the growth of several GaAs/AlGaAs epi-layers on a substrate 41. The top and bottom layers 61 and 43, respectively form the ohmic contact during metallization and both are heavily doped n+GaAs layers with a preferred dopant concentration of $4.0\times10^{18}/cm^3$ and a thickness of 2000 Å. Next to each ohmic layer 61 and 43 are cladding layers 60 and 45, respectively. The cladding layers 60 and 45 are n+ $Al_{0.45}Ga_{0.55}As$ and have a preferred dopant concentration of $1.0\times10^{18}/cm^3$ and a preferred thickness of 10,000 Å. Cladding layers 60 and 45 will be used to pattern and form the guided wave inside the nonlinear directional coupler. Inter-media layers 59 and 47 separate cladding layers 60 and 45 from active layers 57 and 49, respectively. The inter-media layers 59 and 47 are n $Al_{0.2}Ga_{0.8}As$ with a preferred dopant density of $5.0\times10^{17}/cm^3$ and a thickness of 600 Å, and as is known in the art are used to improve inter-layer bonding. The active layers 57 and 49 are p– GaAs and have a preferred dopant density of $1.0\times10^{16}/cm^3$ and a preferred thickness of 2800 Å. In between the active layers 57 and 49 is a spacing layer 53. Spacing layer 53 is separated from active layers 57 and 49 by inter-media layers 55 and 51, respectively. Inter-media layers 55 and 51 are p $Al_{0.2}Ga_{0.8}As$ and have a dopant concentration and thickness substantially the same as, and serve the same purpose as, inter-media layers 59 and 47. The spacing layer 53 is p+ $Al_{0.45}Ga_{0.55}As$ and its structure determines the coupling strength between the two stripe lasers. Spacing layer 53 has a preferred dopant concentration of $1.0 \times 10^{19}/cm^3$ and a thickness of 5500 Å. These epi-structures can be grown by mature MBE or MOCVD growth technology available through several commercial vendors such as EPI, APA and QED.

Figure 12:
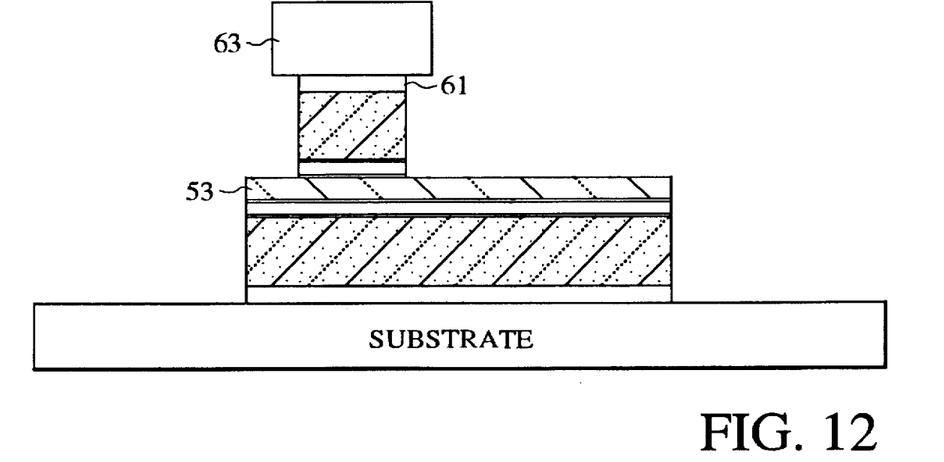

With reference to FIG. 12, After thorough cleaning to remove organic residue, the epi-wafer is first patterned to form the index waveguide of the "slave" laser by means of a mask step over ohmic layer 61 using a positive photoresist 63 and standard photolithographic techniques. It starts with the mesa etching to reach the p+$Al_{0.45}$ $Ga_{0.55}As$ spacing layer 53. The etching process includes selective etching using 1:200 $NH_4OH$:$H_2O_2$ to remove the capping ohmic layer 61, and is then followed by an etch using 3:1:50::$H_3PO_4$:$H_2O_2$:$H_2O$ to reach the $Al_{0.45}Ga_{0.55}As$ spacing layer 53.

Figure 13:
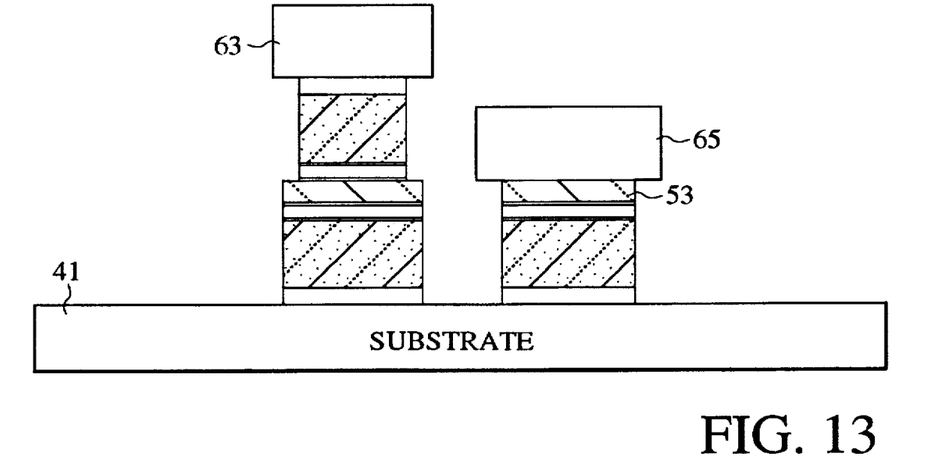

With reference to FIG. 13, a second mask step of photoresist 65 laid over spacing layer 53 is used to pattern the master laser. The pattern is established using the nonselective etch 3:1:50::$H_3PO_4$:$H_2O_2$:$H_2O$ to reach the n+GaAs substrate 41. After this step, the TGOCG device is clearly defined as a two level structure.

Figure 14:
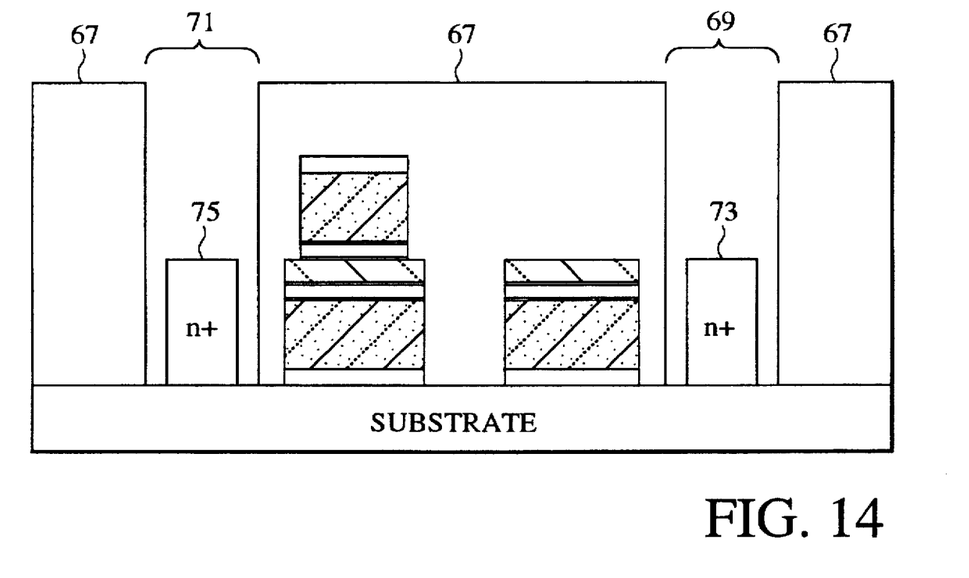

N+ contacts are then formed. As shown in FIG. 14, this step starts with a $Si_3N_4$ passivation 67 using PECVD. One mask is used to define the n+ Ohmic contact windows 69 and 71, followed by a RIE nitride etch. In order to form the Ohmic contacts 73 and 75, Au/Ge/Ni/Au is deposited on the back side by e-beam evaporation. Afterwards, lift-off technique is applied to remove the metal outside the electrode window areas 69 and 71.

Figure 15:
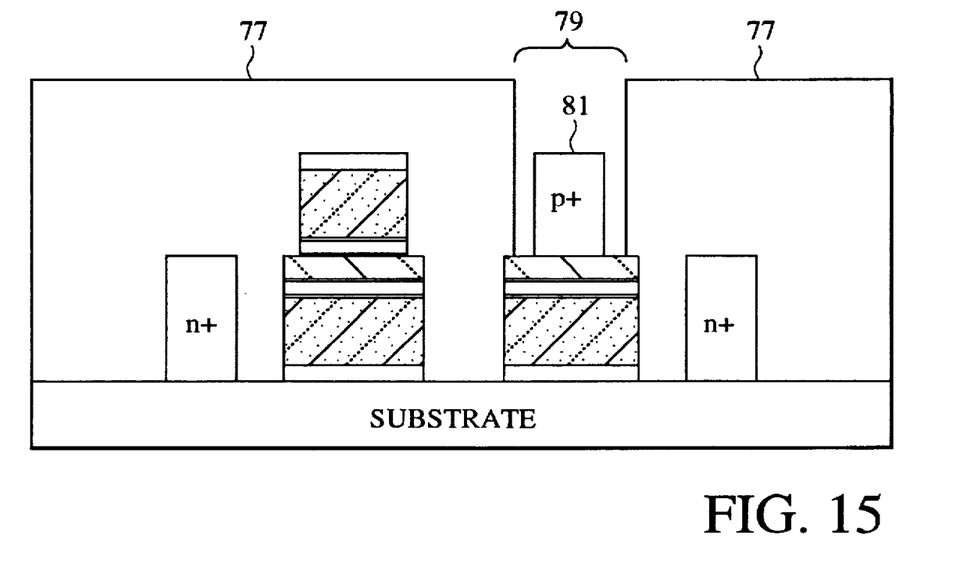

P+ ohmic contacts are then defined with reference to FIG. 15. First, a second $Si_3N_4$ passivation 77 step using PECVD and followed by RIE etching is used to define the p+ ohmic contact window 79. The p+ ohmic metal contact 81 is then formed by Zn/Au deposition through e-beam evaporation. Lift-off procedure is used to remove the metal outside the p+ electrode area. The ohmic contacts 73, 75 and 81 are activated by alloying the device at 440° C. for 30 seconds in a furnace with forming gas ambient.

Figure 16:
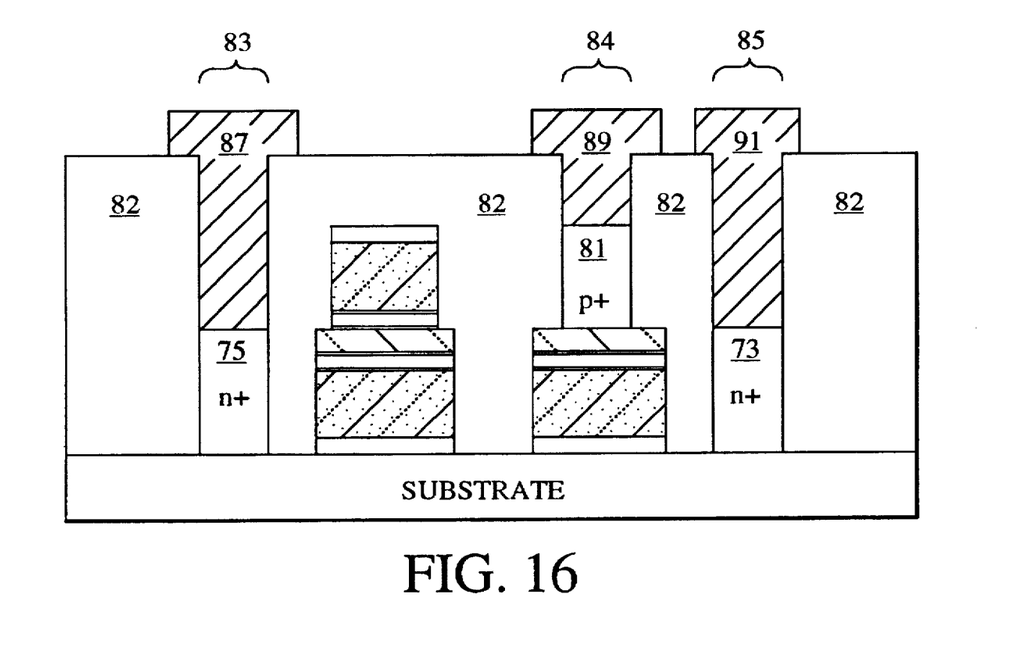

Lastly, with reference to FIG. 16, Ti/Pt/Au Metal Interconnects 87–91 are defined with a third and last $Si_3N_4$ surface passivation 82 and RIE etching to define the interconnect line on-chip areas 83–85. Bonding pads are defined to facilitate required external connection. The laser cavity is then defined by laser bar cleaving and anti-reflection facet coating.

We claim:

1. A self pulsating optical semiconductor apparatus comprising:
   a plurality of semiconductor layers disposed over a substrate, one of said semiconductor layers forming an active region for lightwave generation and propagation under lasing conditions;
   first and second waveguides fabricated in said semiconductor layers and being optically coupled to each other by a nonlinear coupling layer, said first waveguide being in direct optical communication with said active region and said second waveguide having reflector means for establishing optical feedback; and
   means for applying an electrical forward bias to said layers for generating lightwaves in said active region.

2. The apparatus of claim 1 wherein said nonlinear coupling layer forms a nonlinear directional coupler.

3. The apparatus of claim 1 wherein said nonlinear coupling layer has a non-linear Kerr effect.

4. The apparatus of claim 1 wherein said nonlinear coupling layer is formed from a material and is configured such that its index of refraction varies with respect to the intensity of said lightwaves.

5. The apparatus of claim 1 wherein said nonlinear coupling layer has a normalized coupling strength that is not more than $\alpha p/(1+2p)$ and not less than $(1+2p)/\alpha T$ where p is equal to $(\frac{1}{2})g'N_{th}\tau_p(P/P_{th}-1)$, $\alpha$ is a line width enhancement factor and T is a ratio of a charge carrier's lifetime and a photon's lifetime.

6. The apparatus of claim 1 wherein said reflector means is mode selective.

7. The apparatus of claim 1 wherein said reflector means is one of a mirror facet, a grated reflector and a distributed Bragg reflector.

8. The apparatus of claim 1 wherein said first and second waveguides form an in-plane, non-linear, vertical directional coupler.

9. The apparatus of claim 1 wherein said first waveguide is an electrically pumped laser and said second waveguide is an optically pumped laser.

10. A self pulsating optical semiconductor apparatus comprising:
    a directional coupler joining first and second waveguides with a common resonant cavity therebetween;
    a gain medium located within said first waveguide; and
    means located within said common resonant cavity for nonlinearly varying the spatial profile of a laser beam within said common cavity with respect to the intensity of said laser beam.

11. The self pulsating optical semiconductor apparatus of claim 10 wherein said first waveguide is an electrically pumped laser and said second waveguide is an optically pumped laser.

12. The self pulsating optical semiconductor apparatus of claim 10 further comprising reflector means for establishing optical feedback located at an end facet of said second waveguide.

13. The self pulsating optical semiconductor apparatus of claim 12 wherein said reflector means for establishing optical feedback is one of a mirror facet, grated reflector and distributed Bragg reflector.

14. The optical semiconductor apparatus of claim 12 wherein said reflector means is mode selective.

15. The optical semiconductor apparatus of claim 10 wherein said common cavity is configured such that propagating lightwaves within said common resonant cavity have antisymmetric mode interaction.

16. The optical semiconductor apparatus of claim 10 wherein said common resonant cavity has a normalized coupling strength that is not more than $\alpha p/(1+2p)$ and not less than $(1+2p)/\alpha T$ where p is equal to $(\frac{1}{2})g'N_{th}\tau_p(P/P_{th}-1)$, $\alpha$ is a line width enhancement factor and T is a ratio of a charge carrier's lifetime and a photon's lifetime.

17. The optical semiconductor apparatus of claim 10 wherein said common cavity has a structure such that its index of refraction varies with respect to the intensity of said laser beam.

18. The optical semiconductor apparatus of claim 10 further comprising means for applying an electric bias to said gain medium for generating said laser beam within said gain medium.

19. A self pulsating laser comprising:
    a waveguide having an active region;
    means for applying a electric bias to said active region for lightwave generation;

an intensity-dependent external cavity optically coupled to said waveguide; and means for generating mode selective lightwave reflection in said intensity-dependent external cavity.

20. The self pulsating laser of claim 19 wherein said means for generating mode selective lightwave reflection is one of a grated reflector, a mirror facet and a distributed Bragg reflector.

21. The self pulsating laser of claim 19 wherein said intensity-dependent external cavity is made from a material and is configured such that its index of refraction varies with respect to the intensity of said lightwaves.

22. The self pulsating laser of claim 19 wherein said intensity-dependent external cavity has a normalized coupling strength that is not more than $\alpha p/(1+2p)$ and not less than $(1+2p)/\alpha T$ where p is equal to $(\frac{1}{2})g'N_{th}\tau_p(P/P_{th}-1)$, $\alpha$ is a line width enhancement factor and T is a ratio of a charge carrier's lifetime and a photon's lifetime.

23. A method of operating a self pulsating optical apparatus having a resonant cavity, a gain region, means for applying a DC electric bias to said gain region for generating propagating lightwaves, and means for generating mode selective light reflection at an end reflector comprising the steps of:

inducing intensity relaxation oscillation of said lightwaves in response to an application of said DC electric bias to said gain region; and varying the index of refraction of said resonant cavity to vary the temporal and spatial profile of said lightwaves.

24. The method of claim 23 wherein said index of refraction is varied in response to an intensity beat of the propagating lightwaves.

25. The method of claim 23 wherein said varying of the index of refraction causes a constructive gain interaction between the intensity relaxation oscillation of the lightwaves in said resonant cavity.

26. The method of claim 23 wherein said varying of the index of refraction introduces a modulating phase shift of the propagating lightwaves causing them to interfere constructively.

27. The method of claim 23 further including the step of tuning said self pulsating optical apparatus by adjusting said DC electric bias to cause a change in the frequency of said relaxation oscillation.

28. The method of claim 27 further defined by increasing the oscillation frequency with increasing DC bias.

29. The method of claim 23 further defined by establishing a frequency range for said self pulsating optical apparatus with selection of coupling strength between the resonant cavity and the reflector.

* * * * *

UNITED STATES PATENT AND TRADEMARK OFFICE
CERTIFICATE OF CORRECTION

PATENT NO. : 5,708,671
DATED : January 13, 1998
INVENTOR(S) : Sueh-Wen Siao et al.

It is certified that error appears in the above-indentified patent and that said Letters Patent is hereby corrected as shown below:

Title page, in the title, "GIGIHERTZ" should read - - GIGAHERTZ - -.

Col. 1, line 1, "GIGIHERTZ" should read - - GIGAHERTZ - -.

Signed and Sealed this

Twenty-eighth Day of July, 1998

Attest:

BRUCE LEHMAN

Attesting Officer            Commissioner of Patents and Trademarks